US010042021B2

(12) United States Patent
Lee et al.

(10) Patent No.: US 10,042,021 B2
(45) Date of Patent: Aug. 7, 2018

(54) METHOD AND APPARATUS FOR MEASURING MAGNETIC FIELD

(71) Applicant: SAMSUNG ELECTRONICS CO., LTD., Suwon-si (KR)

(72) Inventors: Dae-ho Lee, Seongnam-si (KR); Sang-young Zho, Seoul (KR); Joon-soo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1065 days.

(21) Appl. No.: 14/325,739

(22) Filed: Jul. 8, 2014

(65) Prior Publication Data

US 2015/0008921 A1 Jan. 8, 2015

(30) Foreign Application Priority Data

Jul. 8, 2013 (KR) .................. 10-2013-0079905

(51) Int. Cl.
  *G01R 33/387* (2006.01)
  *G01R 33/565* (2006.01)

(52) U.S. Cl.
  CPC ..... *G01R 33/387* (2013.01); *G01R 33/56518* (2013.01)

(58) Field of Classification Search
  CPC .............................. G01R 33/56518
  USPC .................................. 324/318, 322
  See application file for complete search history.

(56) References Cited

U.S. PATENT DOCUMENTS

| | | | |
|---|---|---|---|
| 4,978,919 A * | 12/1990 | Hinks | ............ G01R 33/02 324/313 |
| 5,345,178 A | 9/1994 | Manabe et al. | |
| 5,450,010 A | 9/1995 | Van Der Meulen et al. | |
| 5,770,943 A | 6/1998 | Zhou | |
| 6,335,620 B1 | 1/2002 | Weissenberger | |
| 7,002,343 B2 | 2/2006 | Weissenberger | |
| 7,218,110 B2 | 5/2007 | Zhang et al. | |
| 9,188,656 B2 * | 11/2015 | Yui | ......... G01R 33/56518 |
| 9,664,765 B2 * | 5/2017 | Hanada | ......... G01R 33/56518 |

(Continued)

FOREIGN PATENT DOCUMENTS

| | | |
|---|---|---|
| EP | 0 735 379 A2 | 10/1996 |
| EP | 1 199 578 A2 | 4/2002 |
| EP | 0 818 689 A1 | 11/2014 |

(Continued)

OTHER PUBLICATIONS

Communication dated Nov. 19, 2014 issued by the Korean Intellectual Property Office in counterpart Korean Patent Application No. 10-2013-0079905.

(Continued)

*Primary Examiner* — Louis Arana
(74) *Attorney, Agent, or Firm* — Sughrue Mion, PLLC

(57) ABSTRACT

A magnetic field measuring method in a magnetic resonance imaging (MRI) apparatus includes applying a radio frequency (RF) pulse to an object, acquiring first and second echo signals from a first readout gradient according to test gradients having different intensities, acquiring third and fourth echo signals from a second readout gradient according to the test gradients having different intensities, and determining a characteristic value of an eddy field based on an echo time (TE) of at least one of the first through the fourth echo signals.

23 Claims, 8 Drawing Sheets

(56) References Cited

U.S. PATENT DOCUMENTS

2012/0098535 A1    4/2012  Kaneta et al.
2016/0245891 A1*   8/2016  Ookawa ........... G01R 33/56518

FOREIGN PATENT DOCUMENTS

| EP | 2 158 842 A1 | 11/2014 |
|---|---|---|
| JP | 6-197883 A | 7/1994 |
| JP | 7-171129 A | 7/1995 |
| JP | 10-272120 A | 10/1998 |
| JP | 2007-181587 A | 7/2007 |
| JP | 2009-160215 A | 7/2009 |
| KR | 1998-064809 A | 10/1998 |

OTHER PUBLICATIONS

Communication dated Nov. 25, 2014 issued by the European Patent Office in counterpart European Patent Application No. 14176158.5.
M. Terpstra et al.; "Localized Eddy Current Compensation Using Quantitative Field Mapping"; Journal of Magnetic Resonance; vol. 131; Mar. 1, 1998; 6 pages total; XP002359902.
Vincent J. Schmithorst et al.; "Automatic Gradient Preemphasis Adjustment: A 15-Minute Journey to Improved Diffusion-Weighted Echo-Planar Imaging"; Magnetic Resonance in Medicine; vol. 47; No. 1; Jan. 1, 2002; 6 pages total; XP001112346.
Communication, dated May 2, 2014, issued by the Korean Intellectual Property Office in counterpart Korean Application No. 10-2013-0079905.

* cited by examiner

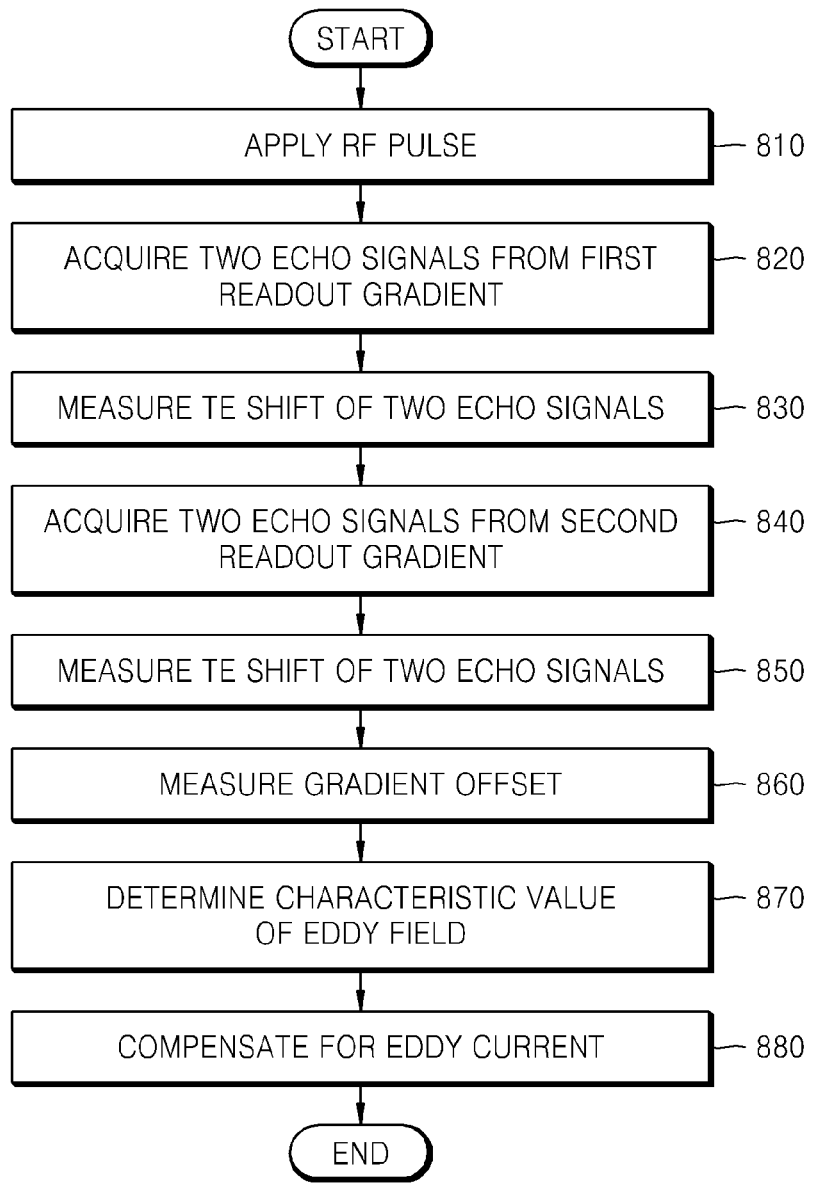

METHOD AND APPARATUS FOR MEASURING MAGNETIC FIELD

RELATED APPLICATIONS

This application claims priority from Korean Patent Application No. 10-2013-0079905, filed on Jul. 8, 2013, in the Korean Intellectual Property Office, the disclosure of which is incorporated herein in its entirety by reference.

BACKGROUND

1. Field

Apparatuses and methods consistent with exemplary embodiments relate to measuring a magnetic field in a magnetic resonance imaging (MRI) apparatus.

2. Description of the Related Art

Magnetic resonance imaging (MRI) apparatuses expose an atomic nucleus to a magnetic field and display an image by using information which is obtained through a resonance of an atomic nucleus. The resonance of an atomic nucleus denotes a phenomenon in which a specific high frequency is inputted to an atomic nucleus magnetized by an external magnetic field, and thus, an atomic nucleus having a lower energy level absorbs higher frequency energy to be excited to a higher energy level. Atomic nuclei have different resonance frequencies depending on the kind, and resonance is affected by an intensity of an external magnetic field. The atomic nuclei are plenty in a human body, and a hydrogen atomic nucleus is used to capture a magnetic resonance image.

The MRI apparatuses are widely used because the MRI apparatuses are noninvasive, have a better contrast of tissue than computed tomography (CT) apparatuses, and have no artifacts caused by osseous tissue. Also, the MRI apparatuses may photograph various cross-sectional images of an object in a desired direction without changing a position of the object.

SUMMARY

One or more exemplary embodiments provide a method and apparatus for measuring a magnetic field in a magnetic resonance imaging (MRI) apparatus.

One or more exemplary embodiments also provide a non-transitory computer-readable storage medium storing a computer program for executing the above described method using a computer.

Additional aspects will be set forth in part in the description which follows and, in part, will be apparent from the description, or may be learned by practice.

According to an aspect of an exemplary embodiment, a magnetic field measuring method of a magnetic resonance imaging (MRI) apparatus includes: applying a radio frequency (RF) pulse to an object; acquiring a first echo signal and a second echo signal from a first readout gradient according to test gradients having different intensities; acquiring a third echo signal and a fourth echo signal from a second readout gradient according to the test gradients having different intensities; and determining a characteristic value of an eddy field based on an echo time (TE) of at least one of the first through the fourth echo signals.

The determining may include determining the characteristic value of the eddy field for which an influence of a gradient offset is compensated.

The determining may include determining the characteristic value including a ratio of an intensity of the eddy field to an intensity of a reference gradient.

The determining may include determining the characteristic value by using a first TE shift between the first and the second echo signals and a second TE shift between the third and the fourth echo signals.

The determining may include frequency converting data of the first through the fourth echo signals to measure the first and the second TE shifts.

The acquiring the first and the second echo signals and the acquiring the third and the fourth echo signals may include acquiring the first and the third echo signals when a test gradient having a first intensity is applied, and acquiring the second and the fourth echo signals when a test gradient having a second intensity different from the first intensity is applied.

One of the first and the second intensities may be substantially equal to zero.

The first and the second intensities may have a same absolute value and opposite polarities.

The first and the second readout gradients may be generated to have different intensities.

The intensities of the first readout gradient and the second readout gradient may have a same shape and opposite polarities.

The magnetic field measuring method may further include measuring a gradient offset based on the TEs of the at least one of the first through the fourth echo signals, wherein the determining may include determining a characteristic value of the eddy field based on the gradient offset.

The measuring of a gradient offset may include determining the characteristic value by using a first TE shift between the first and the second echo signals and a second TE shift between the third and the fourth echo signals.

The magnetic field measuring method may further include correcting an eddy current based on the characteristic value of the eddy field.

The RF pulse may be a 90-degree RF pulse, and the first through the fourth echo signals may be gradient echo signals that are responses to the 90-degree RF pulse.

According to an aspect of another exemplary embodiment, an MRI apparatus for measuring a magnetic field, includes: a radio frequency (RF) transmitter configured to apply an RF pulse to an object; a gradient amplifier configured to apply test gradients having different intensities; an RF receiver configured to acquire a first echo signal and a second echo signal from a first readout gradient and acquire a third echo signal and a fourth echo signal from a second readout gradient, according to the test gradients; and an eddy current compensation processor configured to determine a characteristic value of an eddy field based on an echo time (TE) of at least one of the first through the fourth echo signals.

According to an aspect of still another exemplary embodiment, provided is a non-transitory computer-readable storage medium storing a computer program for executing the magnetic field measuring method using the computer.

According to an aspect of still another exemplary embodiment, an apparatus for measuring a magnetic field in a magnetic resonance imaging (MRI) apparatus includes: at least one processor operable to read and operate according to instructions within a computer program; and at least one memory operable to store at least portions of said computer program for access by said processor; wherein said program includes algorithms to cause said processor to implement: an eddy current characteristic determination module configured to determine a characteristic value of an eddy field based on echo times (TEs) of at least two gradient echo signals generated according to at least one test gradient; and an eddy current compensation module configured to compensate for an eddy current based on the determined characteristic value of the eddy field.

BRIEF DESCRIPTION OF THE DRAWINGS

These and/or other aspects will become apparent and more readily appreciated from the following description of exemplary embodiments, taken in conjunction with the accompanying drawings in which:

FIG. 8 is a detailed flowchart illustrating a magnetic field measuring method according to an exemplary embodiment.

DETAILED DESCRIPTION

Figure 1:
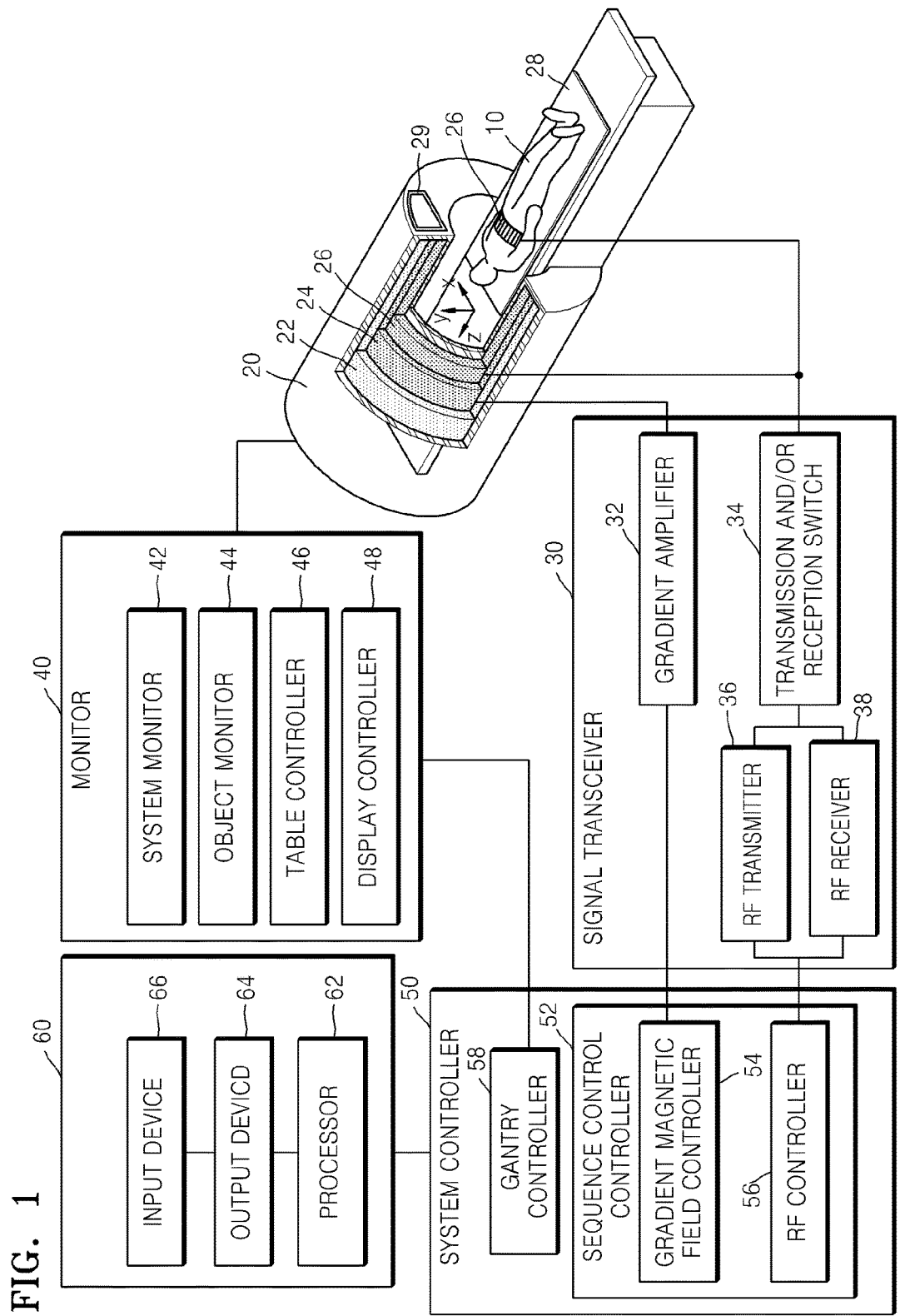
FIG. 1 is a block diagram illustrating a configuration of a general magnetic resonance imaging (MRI) apparatus according to an exemplary embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

Terms used herein have been selected as general terms which are widely used at present, in consideration of the functions of the embodiments, but may be altered according to the intent of an operator skilled in the art, conventional practice, or introduction of new technology. Also, if there is a term which is arbitrarily selected by the applicant in a specific case, in which case a meaning of the term will be described in detail in a corresponding description portion of the disclosure. Therefore, the terms should be defined on the basis of the entire content of this specification instead of a simple name of each of the terms.

In this disclosure below, when it is described that one comprises (or includes or has) some elements, it should be understood that it may comprise (or include or have) only those elements, or it may comprise (or include or have) other elements as well as those elements if there is no specific limitation. The term "module", as used herein, means, but is not limited to, a software or hardware component, such as a Field Programmable Gate Array (FPGA) or an Application Specific Integrated Circuit (ASIC), which performs certain tasks. A module may be configured to reside in an addressable storage medium and configured to execute on one or more processors.

Therefore, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality of the components and modules may be combined into fewer components and modules or further separated into additional components and modules.

The term "image" used herein may denote multi-dimensional data composed of discrete image factors (for example, pixels in a two-dimensional (2D) image and pixels in a three-dimensional (3D) image). For example, an image may include a medical image of an object which is acquired by an X-ray apparatus, a computed tomography (CT) apparatus, a magnetic resonance imaging (MRI) apparatus, an ultrasonic apparatus, or another medical image capturing apparatus.

Moreover, the term "object" or "examinee" used herein may include a person, an animal, a part of the person, or a part of the animal. For example, an object may include an organ such as the liver, the heart, the womb, the brain, breasts, the abdomen, or the like, or a blood vessel. Also, the term "object" may include a phantom. The phantom denotes a material having a volume very close to a density of organisms and an effective atomic number, and may include a spherical phantom having a temper similar to the human body.

Moreover, the term "user" used herein is a medical expert, and may be a doctor, a nurse, a medical technologist, a medical image expert, or the like, or may be an engineer repairing a medical apparatus. However, the meaning of the term "user" is not limited thereto.

Moreover, the expression "magnetic resonance imaging (MRI)" used herein denotes an image of an object which is obtained by using the nuclear magnetic resonance principle.

Moreover, the expression "pulse sequence" used herein denotes a continuation of a repeatedly applied signal in an MRI apparatus. The pulse sequence may include a time parameter of a radio frequency (RF) pulse, for example, a repetition time (TR) and an echo time (TE).

Moreover, the expression "pulse sequence diagram (PSD)" used herein denotes a sequence of events that occur in the MRI apparatus. For example, the pulse sequence diagram may be a schematic diagram showing an RF pulse, a gradient magnetic field, and a magnetic resonance (MR) signal with time.

Exemplary embodiments will be described in detail to be easily embodied by those skilled in the art with reference to the accompanying drawings. The disclosure may, however, be embodied in many different forms and should not be construed as being limited to the embodiments set forth herein. In the accompanying drawings, a portion irrelevant to a description of the disclosure will be omitted for clarity. Moreover, like reference numerals refer to like elements throughout.

MRI apparatuses are apparatuses that express an intensity of a magnetic resonance (MR) signal to an RF signal which is generated in a magnetic field having a specific intensity as a contrast, and thus obtain an image of a tomographic part of an object. For example, an object is placed in a strong magnetic field, and when the RF signal, which resonates only a specific atomic nucleus, for example, a hydrogen atomic nucleus or the like, is momentarily irradiated on the object and then stopped, an MR signal is emitted from the specific atomic nucleus, in which case an MRI apparatus receives the MR signal to obtain an MRI image. The MR signal denotes an RF signal emitted from the object. A level of the MR signal may be determined by, for example, a concentration of a specific atom, for example, hydrogen or the like included in the object, a relaxation time T1, a relaxation time T2, and blood flow.

The MRI apparatuses have features different from those of other imaging apparatuses. Unlike other imaging apparatuses, such as CT apparatuses, in which acquisition of an image is dependent on a direction of detection hardware, the MRI apparatuses may acquire a two-dimensional (2D) image or a three-dimensional (3D) volume image which is arbitrarily oriented. Also, unlike CT apparatuses, X-ray apparatuses, position emission tomography (PET) apparatuses, and single photon emission computed tomography (SPECT) apparatuses, the MRI apparatuses may acquire an image having highly soft tissue without exposing radiation to an object or an examinee, and thus acquire, for example, a neurological image, an intravascular image, a musculoskeletal image, and an oncologic image which need a clear description of abnormal tissue.

FIG. 1 is a block diagram illustrating a configuration of a general MRI apparatus according to an exemplary embodiment. Referring to FIG. 1, the MRI apparatus may include a gantry 20, a signal transceiver 30, a monitor 40, a system controller 50, and an operator 60.

The gantry 20 substantially prevents electromagnetic waves, generated by a main magnet 22, a gradient coil 24, and an RF coil 26, from being emitted to the outside. A static magnetic field and a gradient magnetic field are generated in a bore that is an internal space of the gantry 20, and an RF signal is irradiated on an object 10.

The main magnet 22, the gradient coil 24, and the RF coil 26 may be arranged along a certain direction of the gantry 20. The certain direction may include an axial direction of a coaxial cylinder of the gantry 20. The object 10 may be located on a diagnosis table 28, which is insertable into the coaxial cylinder of the gantry 20 along a horizontal axis thereof.

The main magnet 22 generates a static magnetic field for aligning a direction of a magnetic dipole moment of atomic nuclei included in the object 10 to a certain direction. As a magnetic field generated by the main magnet 22 becomes stronger and more uniform, a more accurate MRI image of the object 10 may be acquired.

The gradient coil 24 includes X, Y, and Z coils that respectively generate gradient magnetic fields in X-axis, Y-axis, and Z-axis directions orthogonal to one another. The gradient coil 24 may induce different resonance frequencies for each part of the object 10, and provide position information of each part of the object 10.

The RF coil 26 may irradiate an RF signal on the object 10, e.g., a patient, and receive an MR signal emitted from the patient. Specifically, the RF coil 26 may transmit an RF signal, having the same frequency as that of a precessional motion, to the patient to cause atomic nuclei to perform the precessional motion, stop the transmission of the RF signal, and receive the MR signal emitted from the patient.

For example, to excite a specific atomic nucleus from a lower energy level to a higher energy level, the RF coil 26 may generate an electromagnetic wave signal, for example, an RF signal having an RF corresponding to a kind of the specific atomic nucleus and apply the electromagnetic wave signal to the object 10. When the electromagnetic wave signal generated by the RF coil 26 is applied to a specific atomic nucleus, the specific atomic nucleus may be excited from a lower energy level to a higher energy level. When the electromagnetic wave signal generated by the RF coil 26 dissipates, an energy level of the atomic nucleus to which the electromagnetic wave is applied may be changed from the higher energy level to the lower energy level, and an electromagnetic wave having a Larmor frequency may be emitted. The RF coil 26 may receive an electromagnetic wave signal emitted from internal atomic nuclei of the object 10.

The RF coil 26 may be implemented as an RF transmission and reception coil that has a function of generating an electromagnetic wave having an RF corresponding to a kind of atomic nucleus and a function of receiving an electromagnetic wave emitted from the atomic nucleus. Alternatively, the RF coil 26 may be configured in a combination of a transmission RF coil that has the function of generating an electromagnetic wave having an RF corresponding to a kind of atomic nucleus and a reception RF coil that has a function of receiving an electromagnetic wave emitted from the atomic nucleus.

The RF coil 26 may be fixed to the gantry 26, or is attachable and/or detachable to and/or from the gantry 26. The attachable and/or detachable RF coil 26 may include a plurality of RF coils for corresponding parts of the object 10 including, for example, a head RF coil, a chest RF coil, a leg RF coil, a neck RF coil, a shoulder RF coil, a wrist RF coil, and an ankle RF coil, depending on a diagnosis part of the object 10. Also, the RF coil 26 may include a birdcage coil, a surface coil, and a transverse electromagnetic (TEM) coil, depending on a shape and a structure of a coil.

Also, the RF coil 26 may include, for example, a transmission dedicated coil, a reception dedicated coil, and a transmission and/or reception coil, depending on an RF signal transmission and/or reception method. The RF coil 26 may communicate with an external device in a wired or wireless manner, and perform dual tune communication based on a communication frequency band. Also, the RF coil 26 may include RF coils corresponding to various numbers of channels such as 16 channels, 32 channels, 72 channels, and 144 channels.

The gantry 20 may further include a display 29 disposed outside the gantry 20 and a display (not shown) disposed inside the gantry 20. A user may display certain information on the displays respectively disposed inside and outside the gantry 20.

The signal transceiver 30 may control a gradient magnetic field which is generated inside (i.e., the bore) the gantry 20, and control transmission and/or reception of an RF signal and an MR signal, according to a certain MR sequence. The signal transceiver 30 may include a gradient amplifier 32, a transmission and/or reception switch 34, an RF transmitter 36, and an RF receiver 38.

The gradient amplifier 32 may drive the gradient coil 24 included in the gantry 20 and supply a pulse signal, used to generate a gradient magnetic field, to the gradient coil 24 according to control by a gradient magnetic field controller 54. Gradient magnetic fields in the X-axis, Y-axis, and Z-axis directions may be synthesized by controlling the pulse signal supplied from the gradient amplifier 32 to the gradient coil 24.

The RF transmitter 36 and the RF receiver 38 may drive the RF coil 26. The RF transmitter 36 may supply an RF pulse having a Larmor frequency to the RF coil 26, and the RF receiver 38 may receive an MR signal from the RF coil 26.

The transmission and/or reception switch 34 may adjust a transmission and/or reception direction of each of the RF signal and MR signal between the RF transmitter 36 or the RF receiver 38 and the RF coil 26. For example, in a transmission mode, the transmission and/or reception switch 34 may irradiate the RF signal on the object 10 through the RF coil 26, and in a reception mode, the transmission and/or reception switch 34 may receive the MR signal from the object 10 through the RF coil 26. The transmission and/or reception switch 34 may be controlled by a control signal from an RF controller 56.

The monitor 40 may monitor or control the gantry 20 or elements included in the gantry 20. The monitor 40 may include a system monitor 42, an object monitor 44, a table controller 46, and a display controller 48.

The system monitor 42 may monitor or control a state of a static magnetic field, a state of a gradient magnetic field, a state of an RF signal, a state of an RF coil, a state of a table, a state of an element that measures body information of the object 10, a power supply state, a state of a heat exchanger, a state of a compressor, etc.

The object monitor 44 monitors a state of the object 10. Specifically, the object monitor 44 may include, for example, a camera for observing a movement or position of the object 10, a breath measurer for measuring a breath of the object 10, an electrocardiogram (ECG) measurer for measuring of an ECG of the object 10, or a body temperature measurer for measuring a body temperature of the object 10.

The table controller 46 controls a movement of the diagnosis table 28 with the object 10 located thereon. The table controller 46 may control the movement of the diagnosis table 28 according to sequence control by the sequence controller 50. For example, in photographing a moving image of the object 10, the table controller 46 may continuously or intermittently move the diagnosis table 28 according to the sequence control by the sequence controller 50 to photograph the object 10 at a view greater than a field of view (FOV) of the gantry 20.

The display controller 48 controls a plurality of displays which are respectively disposed outside and inside the gantry 20. Specifically, the display controller 48 may control turn-on or turn-off of the displays disposed outside and inside the gantry 20, or control a screen displayed by each of the displays. Also, when a speaker (not shown) is disposed inside or outside the gantry 20, the display controller 48 may control turn-on or turn-off of the speaker or sound outputted by the speaker.

The system controller 50 may include a sequence controller 52 that controls a sequence of signals generated in the gantry 20 and a gantry controller 58 that controls the gantry 20 and elements mounted on the gantry 20. The system controller 50 may include a processor, a microprocessor, a central processing unit (CPU), or an integrated circuit for executing programmable instructions stored in a storage such as a memory (not shown).

The sequence controller 52 may include the gradient magnetic field controller 54 that controls the gradient amplifier 32 and the RF controller 56 that controls the RF transmitter 36, the RF receiver 38, and the transmission and/or reception switch 34. The sequence controller 52 may control the gradient amplifier 32, the RF transmitter 36, the RF receiver 38, and the transmission and/or reception switch 34 according to a pulse sequence received from the operator 60. Here, the pulse sequence includes all information necessary to control the gradient amplifier 32, the RF transmitter 36, the RF receiver 38, and the transmission and/or reception switch 34, and for example, may include information on an intensity of a pulse signal applied to the gradient coil 24, an application time, and an application timing thereof.

The operator 60 may provide pulse sequence information to the system controller 50 and simultaneously control an overall operation of the MRI apparatus. The operator 60 may include an image processor 62 that processes the MR signal received from the RF receiver 38, an output device 64, and an input device 66.

The image processor 62 may process the MR signal received from the RF receiver 38 to generate an MRI image that is MRI image data of the object 10. The image processor 62 may perform various signal processing operations such as amplification, frequency conversion, phase detection, low-frequency amplification, and filtering of the MR signal received by the RF receiver 38. The image processor 62 may include a processor, a microprocessor, a central processing unit (CPU), or an integrated circuit for executing programmable instructions stored in a storage such as a memory (not shown).

The image processor 62, for example, may arrange digital data in a k-space of a memory, and perform a 2D or 3D Fourier transform on the digital data to reconfigure the digital data into image data.

Moreover, in one embodiment, the image processor 62 may perform a synthesis processing or a differential operation processing on the image data. The synthesis processing may include an addition processing and a maximum intensity projection (MIP) processing on a pixel. Also, the image processor 62 may store the image data, on which the synthesis processing or differential operation processing has been performed, in addition to the reconfigured image data without synthesis processing or differential operation processing, in a memory (not shown) or an external server (not shown).

Moreover, the image processor 62 may perform, in parallel, various signal processing on the MR signal. For example, the image processor 62 may perform, in parallel, signal processing on a plurality of MR signals received by a multi-channel RF coil to reconfigure the plurality of MR signals into image data.

The output device 64 may output the image data generated or the image data reconfigured by the image processor 62 to a user. Also, the output device 64 may output information for manipulating the MRI apparatus such as a user interface (UI), user information, or object information, in addition to the MRI image. The output device 64 may include, for example, a speaker, a printer, a CRT display, a liquid crystal display (LCD), a plasma display panel (PDP), an organic light emitting diode (OLED) display, an field emission display (FED), an LED display, a vacuum fluorescent display (VFD), a digital light processing (DLP) display, a primary flight display (PFD), a 3D display, a transparent display, etc., and include various output devices within a scope obvious to those skilled in the art.

The user may input object information, parameter information, a scanning condition, a pulse sequence, information on image synthesis or differential operation, etc. by using the input device 66. The input device 66 may include, for example, a keyboard, a mouse, a trackball, a voice recognizer, a gesture recognizer, a touch pad, a touch screen, etc., and include various input devices within a scope obvious to those skilled in the art.

FIG. 1 illustrates the signal transceiver 30, the monitor 40, the system controller 50, and the operator 60 as separate elements. However, those skilled in the art understand that respective functions performed by the signal transceiver 30, the monitor 40, the system controller 50, and the operator 60 may be performed by different elements. For example, it has been described above that the image processor 62 converts the MR signal received by the RF receiver 38 into a digital signal, but the conversion from the MR signal to the digital signal may be performed directly by the RF receiver 38 or the RF coil 26 in an alternative embodiment.

The gantry 20, the signal transceiver 30, the monitor 40, the system controller 50, and the operator 60 may be connected to one another in a wired or wireless manner. When the above elements are connected in the wired manner, an element for synchronizing a clock therebetween may be further provided. Communication between the gantry 20, the signal transceiver 30, the monitor 40, the system controller 50, and the operator 60 may use a high-speed digital interface such as, for example, low voltage differential signaling (LVDS), asynchronous serial communication such as a universal asynchronous receiver transmitter (UART), a low-delay network protocol such as synchronous serial communication or a can area network (CAN), or optical communication, and use various communication schemes within a scope obvious to those skilled in the art.

Figure 2A:
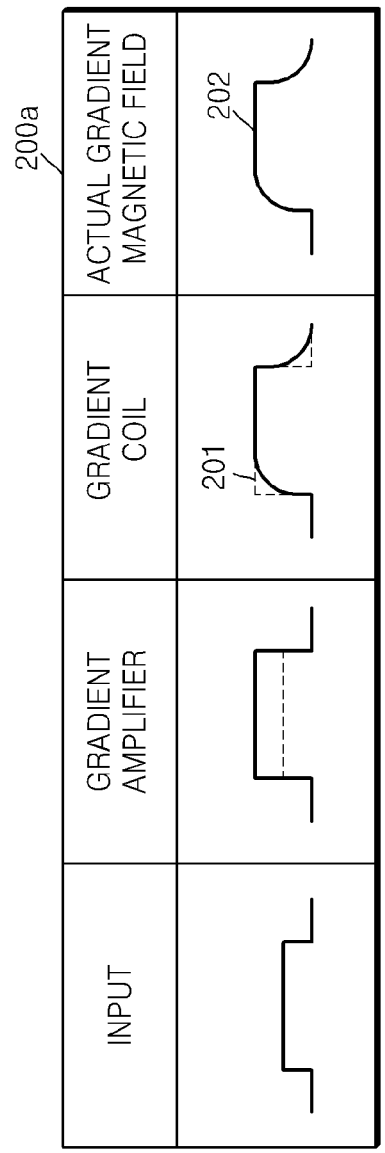
FIGS. 2A and 2B are diagrams illustrating an operation of compensating for an eddy current according to an exemplary embodiment.
Figure 2B:
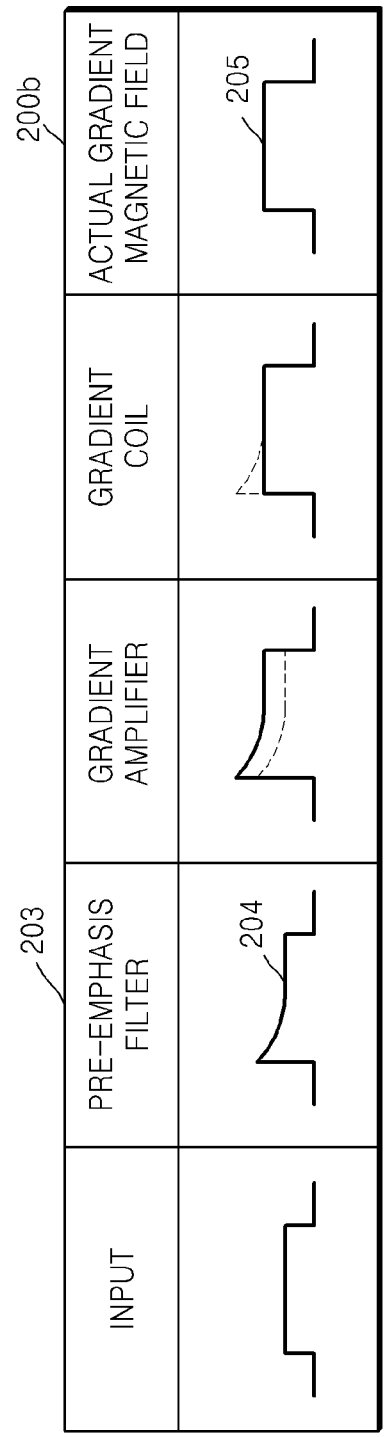

FIGS. 2A and 2B are diagrams showing an operation of compensating for an eddy current according to an exemplary embodiment.

When a gradient magnetic field generated in a gradient coil is changed, an eddy field based on an eddy current is generated. Generally, MRI apparatuses measure a physical characteristic of the eddy field and compensate for the eddy current, thereby reducing an influence of the eddy current.

As shown in Table 200a illustrated in FIG. 2A, an input pulse for generating a gradient magnetic field is amplified by a gradient amplifier and applied to a gradient coil. In addition, due to an eddy current, a difference occurs between a gradient magnetic field 201 intended according to the pulse applied by the MRI apparatus and an actually generated gradient magnetic field 202.

To overcome this problem, as shown in Table 200b illustrated in FIG. 2B, an MRI apparatus according to an exemplary embodiment compensates for an eddy current. The MRI apparatus according to an exemplary embodiment may measure the actually generated gradient magnetic field 202 described above in FIG. 2A, express an influence of the eddy current as a transfer function, and generate an inverse transfer function. Accordingly, before applying the pulse to the gradient amplifier, the MRI apparatus according to an exemplary embodiment may generate a pulse 204, in which the inverse transfer function is reflected by using a pre-emphasis filter 203, to realize the same gradient magnetic field 205 substantially the same or similar to the intended gradient magnetic field 201.

The MRI apparatus compensates for the eddy current through the above-described operations to substantially remove an influence of the eddy current, thus acquiring an MRI image with an improved image quality.

Figure 3:
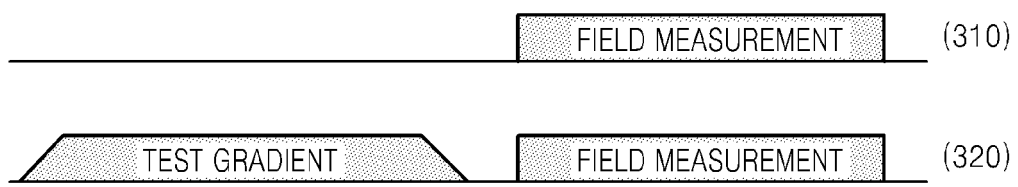
FIG. 3 is a diagram showing an operation that applies a test gradient for compensating for an eddy current according to an exemplary embodiment.

FIG. 3 is a diagram showing an operation that applies a test gradient for compensating for an eddy current according to an exemplary embodiment.

As described above with respect to FIGS. 2A and 2B, the MRI apparatus according to an exemplary embodiment measures an eddy field for compensating for an eddy current. The MRI apparatus according to an exemplary embodiment may use a test gradient as shown in FIG. 3 for measuring the eddy field.

That is, the MRI apparatus according to an exemplary embodiment measures a TE of an echo signal 310 which is received when the test gradient is not applied. Also, the MRI apparatus according to an exemplary embodiment measures a TE of an echo signal 320, which is received when the test gradient is applied. The MRI apparatus may calculate a linear component of an eddy field by using a TE shift that is a time difference between the two measured echo signals 310 and 320. The linear component of the eddy field may be expressed as a ratio "$\alpha$" of an intensity "$G_{eddy}$" of the eddy field to an intensity "$G_{test}$" of the test gradient. Here, $\alpha$ is expressed as $G_{eddy}/G_{test}$ (i.e., $\alpha = G_{eddy}/G_{test}$).

In detail, the MRI apparatus according to an exemplary embodiment may measure a TE "$TE_p$" of an echo signal (for example, a gradient echo signal), which is a response to an RF signal, and a TE shift "$\tau_p$" of the echo signal when the test gradient is applied. Therefore, a relationship between the intensity "$G_{eddy}$" of the eddy field and a readout gradient "$G_{read}$" may be expressed as the following Equation (1):

$$G_{eddy} * (TE_p + \tau_p) = -\tau_p * G_{read} \quad (1)$$

Equation (1) indicates that an echo signal received through the readout gradient is delayed by an influence of the eddy field. The following Equation (2) may be derived from Equation (1):

$$\frac{G_{eddy}}{G_{read}} = \frac{-\tau_p}{TE_p + \tau_p} = \beta_p \quad (2)$$

Accordingly, the linear component of the eddy field may be expressed as the following Equation (3) by using a constant "$\beta_p$" of Equation (2):

$$\alpha = \frac{G_{eddy}}{G_{test}} = \frac{G_{read}}{G_{test}} * \beta_p \quad (3)$$

A characteristic of the gradient magnetic field may include a gradient offset. The gradient offset is based on a physical characteristic of the gradient coil generating the gradient magnetic field and a physical characteristic of the gradient amplifier, and may denote an intensity difference between a gradient magnetic field intended by the MRI apparatus and a physically generated gradient magnetic field. In addition, the gradient offset may cause a degradation in the quality of an MRI image.

Considering the above-described gradient offset, Equations (1) to (3) described above may not be applied without modification. That is, the MRI apparatus needs to consider the gradient offset for accurately measuring a characteristic of an eddy field. An exemplary embodiment of an MRI apparatus that compensates for an eddy current by reflecting an influence of the gradient offset will be described.

Figure 4:
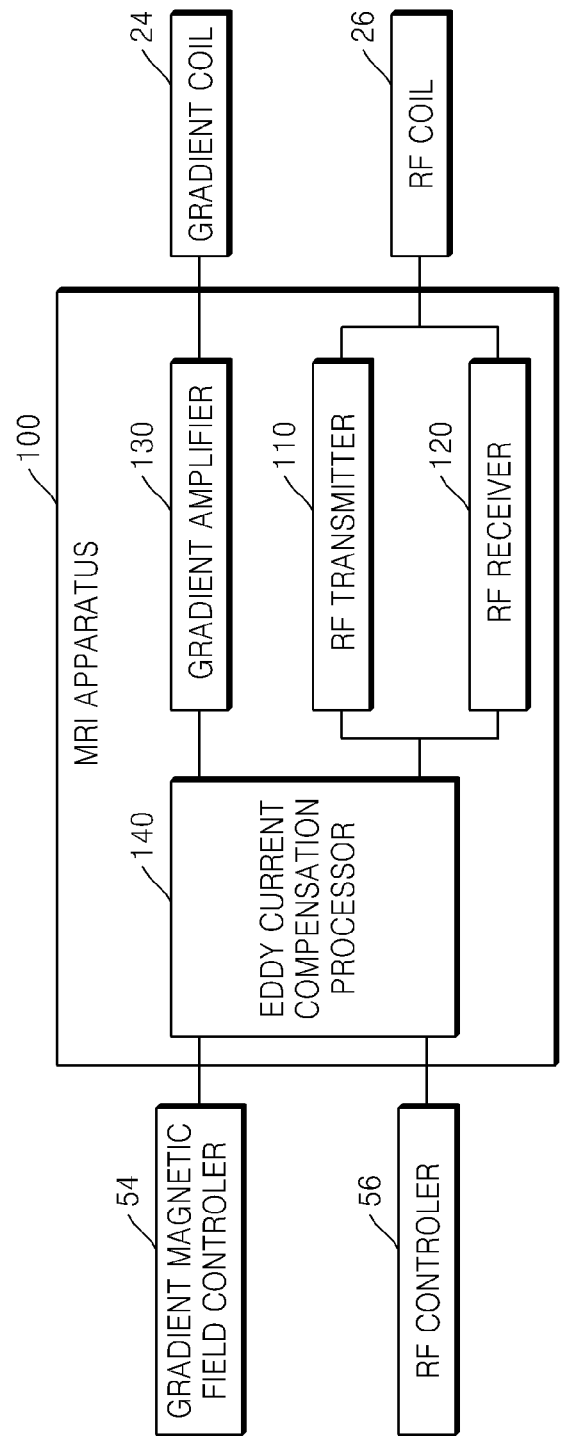
FIG. 4 is a block diagram illustrating a configuration of an MRI apparatus according to an exemplary embodiment.

FIG. 4 is a block diagram illustrating a configuration of an MRI apparatus 100 according to an exemplary embodiment. The MRI apparatus 100 according to an exemplary embodiment may include an RF transmitter 110, an RF receiver 120, a gradient amplifier 130, and an eddy current compensation processor 140. The MRI apparatus 100 is not limited to the one illustrated, and may further include another element in addition to the elements illustrated in FIG. 4.

The RF transmitter 110 applies an RF signal or an RF pulse to the RF coil 26. The RF transmitter 110 according to an exemplary embodiment may apply a 90-degree RF pulse for magnetizing an object. Here, a time between a time when the 90-degree RF pulse is applied and a time when an echo signal that is a response to the RF pulse is received may denote a TE.

The RF receiver 120 acquires an MR signal received by the RF coil 26. That is, the RF receiver 120 may acquire a TE as a response to the applied RF signal or RF pulse. Also, the RF receiver 120 may receive a gradient echo signal as a response to the 90-degree RF pulse applied when a gradient magnetic field is generated by a gradient coil.

The RF receiver 120 may acquire an echo signal based on a test gradient applied to a slice selection gradient coil (not shown). That is, in receiving an echo signal according to a readout gradient, the RF receiver 120 may acquire the echo signals at different times according to test gradients having different intensities being generated by the slice selection gradient coil.

In detail, as described above with respect to FIG. 3, the RF receiver 120 may receive an echo signal of which a TE is changed, according to a test gradient having an adjusted level. In other words, a TE that is a time when a plurality of echo signals are acquired may vary according to a level of the test gradient.

Moreover, the RF receiver 120 may acquire a plurality of different echo signals according to the readout gradient having different levels. That is, the RF receiver 120 may acquire an echo signal of which a physical characteristic is changed according to readout gradients being generated. The readout gradients may have different levels and shapes. For example, an influence of a readout gradient of the gradient offset is changed according to a polarity of the readout gradient being generated, and the RF receiver 120 may receive echo signals at different times. That is, the RF receiver 120 may receive echo signals having different echo times.

The gradient amplifier 130 applies a gradient pulse to the gradient coil 24 to generate a gradient magnetic field. The gradient amplifier 130 according to an exemplary embodiment may generate a slice selection gradient, a test gradient, and a readout gradient in the gradient coil 24.

As described above, the RF receiver 120 may receive an echo signal which is changed according to the readout gradient generated by the gradient amplifier 130. Also, the RF receiver 120 may receive an echo signal which is changed according to the test gradient generated by the gradient amplifier 130. That is, the gradient amplifier 130 may generate a gradient magnetic field in the gradient coil 24, thereby adjusting a physical characteristic of the echo signal received by the RF receiver 120.

For example, when it is assumed that two test gradients are used, the gradient amplifier 130 may adjust an intensity of a test gradient such that one of the two test gradients may be set to substantially equal to zero. Alternatively, the gradient amplifier 130 may set intensities of the two test gradients such that the two test gradients have intensities having the same absolute value and opposite polarities. Also, the gradient amplifier 130 may generate the test gradients such that an intensity of one of the two test gradients is several times an intensity of the other test gradient.

As another example, the gradient amplifier 130 may generate readout gradients having different intensities. For example, the gradient amplifier 130 may sequentially generate readout gradients, which have intensities having the same absolute value and opposite polarities, or readout gradients having the same polarity and different absolute values.

A gradient amplifier 130 according to an exemplary embodiment may apply a gradient magnetic field, having an intensity and a shape compensated for by the eddy current compensation processor 140, to the gradient coil 24. That is, when the eddy current compensation processor 140 measures a characteristic value of an eddy field to compensate for an eddy current, the gradient amplifier 130 may generate a gradient magnetic field in the gradient coil 24 according to a pulse of which an eddy current is compensated for.

The eddy current compensation processor 140 compensates for an influence of the eddy field. The eddy current compensation processor 140 may determine a characteristic value of the eddy field to measure the influence of the eddy field. The characteristic value of the eddy field, as described above with respect to FIG. 3, may be expressed as a ratio of an intensity of the eddy field to an intensity of a certain reference gradient (for example, a test gradient).

In measuring an eddy field, the eddy current compensation processor 140 may determine a characteristic value of the eddy field from which an influence of a gradient offset is substantially removed. For example, the eddy current compensation processor 140 may determine the characteristic value of the eddy field from which the influence of the gradient offset is substantially removed, by using TEs of a plurality of echo signals received. The eddy current compensation processor 140 may measure a TE shift of each of the plurality of echo signals to measure the eddy field. A further detailed description thereof will be described below with reference to FIG. 7.

An eddy current compensation processor 140 according to an exemplary embodiment may measure an eddy field from which an influence of a gradient offset is substantially removed, and also measure the gradient offset. For example, the eddy current compensation processor 140 may measure a gradient offset by using a sum and a difference of TE shifts of echo signals, and substantially remove an influence of the measured gradient offset to measure an eddy field.

In measuring a TE shift of an echo signal, the eddy current compensation processor 140 according to an exemplary embodiment may use a frequency conversion. That is, the eddy current compensation processor 140 may perform a frequency conversion operation, such as a Fourier transform, on data of an acquired echo signal, and measure a phase shift in a frequency-converted image. The eddy current compensation processor 140 may inversely convert the measured phase shift in a frequency domain to calculate a TE shift in a time domain.

Therefore, the eddy current compensation processor 140 may more accurately measure a delay time than when measuring the delay time in the time domain without converting a frequency. That is, in measuring a position of a peak value that becomes a reference for measuring a delay time of an echo signal, the eddy current compensation processor 140 may more accurately measure a delay time less than a sampling time.

Accordingly, the eddy current compensation processor 140 may compensate for an eddy current by using the measured characteristic value of the eddy field. That is, the eddy current compensation processor 140 may measure a characteristic value of an eddy field from which an influence of a gradient offset is substantially removed, and supply a pulse, of which an eddy current is compensated for, to the gradient amplifier 130. Therefore, the gradient amplifier 130 may apply the compensated pulse to the gradient coil 24, thereby generating a gradient magnetic field intended by the MRI apparatus 100. Accordingly, the MRI apparatus 100 may improve a quality of an MRI image.

Exemplary embodiments of a method of measuring a magnetic field by using the elements included in the MRI apparatus 100 will be described in detail with reference to FIGS. 5 to 8.

Figure 5:
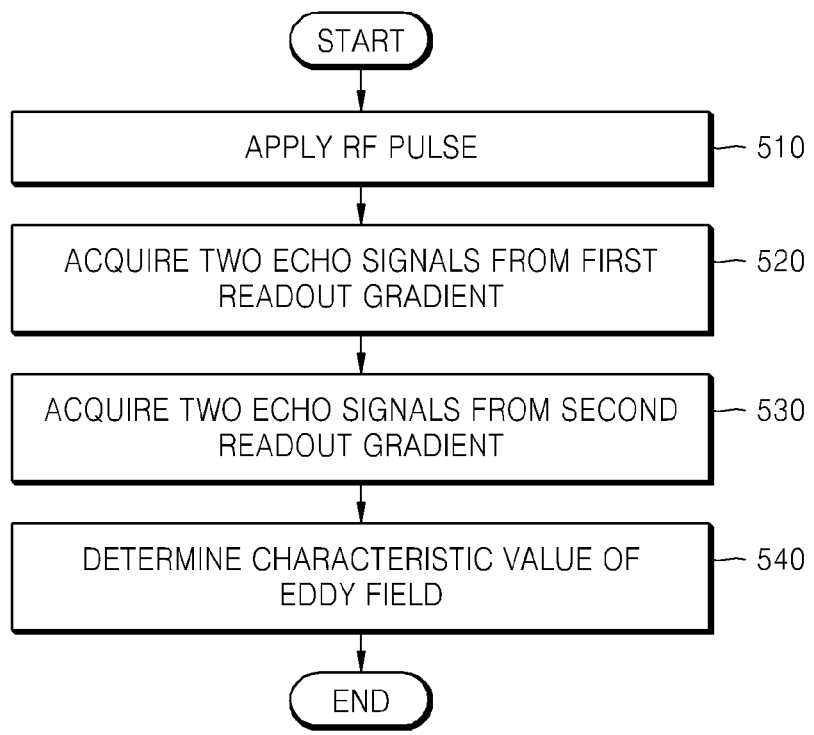
FIG. 5 is a flowchart illustrating a magnetic field measuring method according to an exemplary embodiment.

FIG. 5 is a flowchart illustrating a magnetic field measuring method according to an exemplary embodiment. The magnetic field measuring method of FIG. 5 includes a plurality of operations that may be performed by the RF transmitter 110, the RF receiver 120, the gradient amplifier 130, and the eddy current compensation processor 140 of the MRI apparatus 100 of FIG. 4. Thus, although details are not provided below, the description of the elements of FIG. 4 may be applied to the magnetic field measuring method of FIG. 5.

In operation 510, the MRI apparatus 100 applies an RF pulse. The MRI apparatus 100 applies the RF pulse to the object 10 through the RF coil 26. The MRI apparatus 100 may sequentially apply a plurality of RF pulses. Also, the MRI apparatus 100 may apply a 90-degree RF pulse for magnetizing the object 10.

In operation 520, the MRI apparatus 100 acquires two echo signals from a first readout gradient. The echo signals may include a gradient echo for an RF 90-degree pulse. For convenience of description, the two echo signals in operation 520 are referred to as a first echo signal and a second echo signal, respectively.

The MRI apparatus 100 may acquire two different echo signals, namely, the first and the second echo signals, based on a readout gradient generated in the gradient coil 24. The MRI apparatus 100 according to an exemplary embodiment may acquire the first and the second echo signals according to test gradients having, e.g., different intensities being generated in the slice selection gradient coil.

For example, the MRI apparatus 100 may acquire the first echo signal when a test gradient having an intensity of substantially 0 is applied thereto, namely, when the test gradient is not applied thereto, and acquire the second echo signal when a test gradient, having an intensity that is not substantially 0, is applied thereto. Also, the MRI apparatus 100 may respectively acquire the first and the second echo signals according to two test gradients which have intensities having the same absolute value and different polarities.

In operation 530, the MRI apparatus 100 acquires two echo signals from a second readout gradient. For convenience of description, the two echo signals in operation 530 are referred to as a third echo signal and a fourth echo signal, respectively.

The MRI apparatus 100 generates the second readout gradient having an intensity different from that of the first readout gradient in operation 520, thereby acquiring the third and the fourth echo signals. For example, intensities of the two readout gradients, the first and the second readout gradients, may have the same shape and different polarities.

The MRI apparatus 100 according to an exemplary embodiment may acquire the first echo signal and the third echo signal from the same test gradient, and acquire the second echo signal and the fourth echo signal from the same other test gradient. That is, the MRI apparatus 100 may apply the two test gradients, which are applied in operation 520, having different intensities again (in operation 530.

In operation 540, the MRI apparatus 100 determines a characteristic value of an eddy field. The MRI apparatus 100 may measure the eddy field by using TEs of the echo signals which are acquired in operations 520 and 530.

In detail, the MRI apparatus 100 may measure a TE shift between the first and the second echo signals and a TE shift between the third and the fourth echo signals. That is, the MRI apparatus 100 may measure respective times when four echo signals, the first through the fourth echo signals, are acquired, thereby determining a TE shift in operations 520 and 530.

Therefore, the MRI apparatus 100 may measure a characteristic value of an eddy field, for example, a linear component of an eddy field, from which an influence of a gradient offset is substantially removed by using TEs and TE shifts of the four echo signals. A further detailed description thereof will be provided with reference to FIG. 7.

Figure 6:
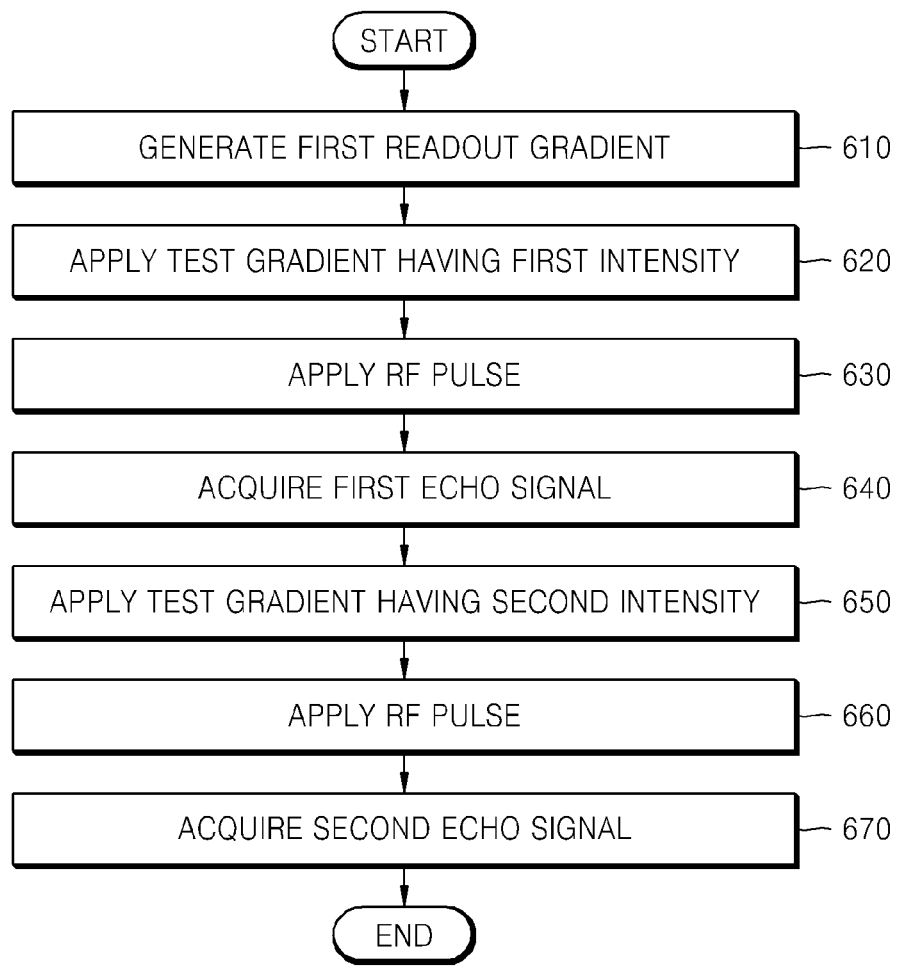
FIG. 6 is a detailed flowchart illustrating operation 520 of FIG. 5.

FIG. 6 is a detailed flowchart illustrating operation 520 of FIG. 5.

In operation 610, the MRI apparatus 100 according to an exemplary embodiment generates the first readout gradient in the gradient coil. The first readout gradient may be generated to have a first intensity.

In operation 620, the MRI apparatus 100 applies a test gradient having the first intensity. The MRI apparatus 100 may apply the test gradient to the slice selection gradient coil.

In operation 630, the MRI apparatus 100 applies an RF pulse to the RF coil. The RF pulse according to an exemplary embodiment may include a 90-degree RF pulse.

In operation 640, the MRI apparatus 100 acquires the first echo signal that is a response to the RF pulse. That is, the MRI apparatus 100 receives the first echo signal based on the first readout gradient. Then, the MRI apparatus 100 may measure a TE that is a time when the first echo signal is received.

In operation 650, the MRI apparatus 100 applies a test gradient having a second intensity. For example, the MRI apparatus 100 may apply the test gradient having an intensity different from that of the test gradient in operation 620. According to an exemplary embodiment, one of the test gradients in operations 620 and 630 may have an intensity of substantially 0. Alternatively, the two test gradients may have intensities having the same absolute value and opposite polarities. Still alternatively, test gradients having different intensity absolute values may be applied.

In operation 660, the MRI apparatus 100 applies the RF pulse, and in operation 670, the MRI apparatus 100 acquires the second echo signal. The second echo signal in operation 660 may be received at a TE that is different from that of the first echo signal which is received in operation 640. In other words, a difference exists between a TE of the first echo signal and a TE of the second echo signal, and the MRI apparatus 100 may measure a TE shift between the two echo signals.

Although not shown in FIG. 6, the MRI apparatus 100 may generate the second readout gradient after operation 670, and repeat the above-described operations 620 to 670 with respect to the second readout gradient. That is, the MRI apparatus 100 may repeat a series of operations for measuring a TE shift between two echo signals based on the second readout gradient having an intensity that is different from the readout gradient of operation 610.

In measuring a TE shift, the MRI apparatus 100 may use a frequency conversion operation as described above with reference to FIG. 4. That is, the MRI apparatus 100 may measure a phase shift in a frequency domain by performing the frequency conversion operation such as the Fourier transform, and thus may more accurately measure a TE in a time domain.

Accordingly, the MRI apparatus 100 may measure a characteristic value of an eddy field by using the two measured TE shifts. A further detailed description thereof is provided with reference to FIG. 7.

Figure 7:
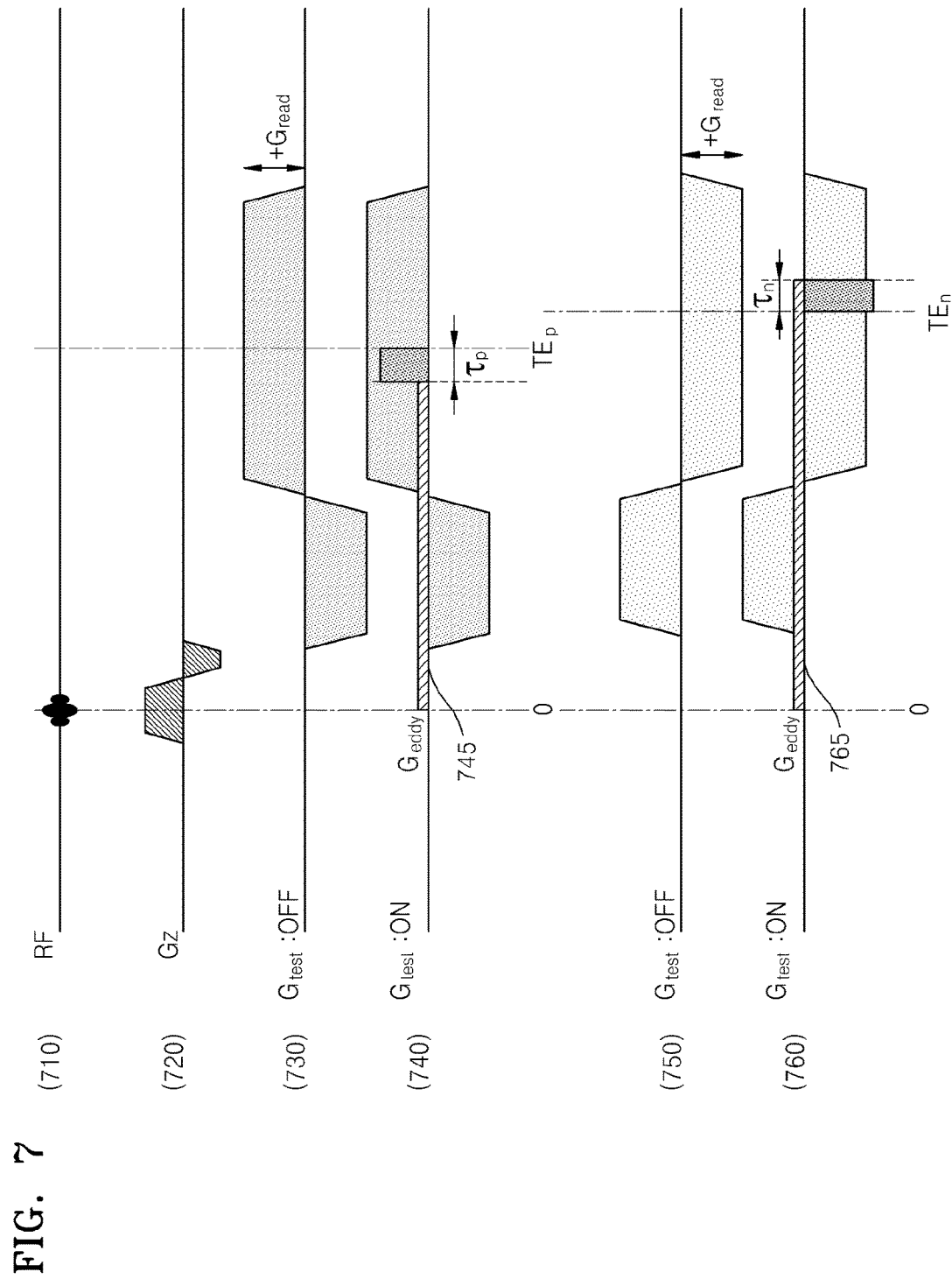
FIG. 7 is a diagram showing a pulse sequence diagram according to an exemplary embodiment.

FIG. 7 is a diagram showing a pulse sequence diagram according to an exemplary embodiment. In FIG. 7, the MRI apparatus 100 according to an exemplary embodiment applies an RF pulse 710 to the RF coil. Also, the MRI apparatus 100 applies a pulse 720 to a Z-axis gradient coil to generate a slice selection gradient magnetic field Gz.

In FIG. 7, as an example of two test gradients having different intensities, a test gradient having an intensity of substantially 0 and another test gradient having an intensity that is not substantially 0 will be described. That is, an example of acquiring echo signals when a test gradient is applied and when the test gradient is not applied will be described. However, the disclosure is not limited to this example. For example, as described above, the MRI apparatus 100 may measure an eddy field by using the test gradients having different intensities that are not substantially 0.

Although not explicitly shown in FIG. 7, the MRI apparatus 100 may apply a test gradient to the slice selection gradient coil. That is, the MRI apparatus 100 may apply a test gradient having a certain intensity to the slice selection gradient coil prior to generating a Z-axis slice selection gradient magnetic field Gz by applying the pulse 720.

Accordingly, the MRI apparatus 100 generates a first readout gradient, and acquires first and second echo signals based on the first readout gradient with respect to, for example, when the test gradient is not applied and when the test gradient is applied, respectively.

In an exemplary embodiment, in a case 730 in which a test gradient is not applied, namely, a case in which a test gradient having an intensity of substantially 0 is applied, the MRI apparatus 100 acquires the first echo signal based on the first readout gradient having an intensity "$G_{read}$", and measures a TE of the first echo signal. In this example, the TE of the first echo signal is referred to as "$TE_p$".

Also, in an exemplary embodiment, in a case 740 in which the test gradient is applied, the MRI apparatus 100 acquires the second echo signal based on the first readout gradient, and measures a TE of the second echo signal. In addition, the test gradient is applied and then dissipates before the pulse 720 for generating the slice selection gradient magnetic field is applied, and thus, an eddy field 745 having the intensity "$G_{eddy}$" affects the second echo signal.

Due to the eddy field 745 having a positive intensity, the second echo signal is received earlier than a TE "$TE_p$" of the first echo signal by "$\tau_p$". That is, the MRI apparatus 100 may receive the first and the second echo signals with a difference of the TE shift "$\tau_p$".

As described above with reference to FIG. 3, when a gradient offset exists, Equations (1) to (3) are required to be changed. Therefore, Equation (4) may be derived by considering a gradient offset as well as an eddy field, a readout gradient, and a TE.

$$G_{eddy}*(TE_p+\tau_p)=-\tau_p*(G_{read}+G_{offset}) \tag{4}$$

Equation (4) indicates that when a gradient offset $G_{offset}$ exists, a time when the eddy field is generated causes a TE shift of an echo signal which is received through the readout gradient.

Moreover, the constant "$\beta_p$" that is expressed using the TE and TE shift of the first echo signal as described above in Equation (2) may be expressed as the following Equation (5), from Equation (4):

$$\beta_p = \frac{G_{eddy}}{G_{read}+G_{offset}} = \frac{-\tau_p}{TE_p+\tau_p} \tag{5}$$

The MRI apparatus 100 repeats the above-described operation with the second readout gradient having an intensity that is different from that of the first readout gradient having the intensity "$G_{read}$". In this example, the second readout gradient has an intensity "$-G_{read}$" having the same shape as and an opposite polarity to that of the first readout gradient. The MRI apparatus 100 acquires third and fourth echo signals with the second readout gradient with respect to, for example, when the test gradient is not applied and when the test gradient is applied, respectively.

In an exemplary embodiment, in a case 750 in which the test gradient is not applied, the MRI apparatus 100 acquires the third echo signal based on the second readout gradient having the intensity "$-G_{read}$", and measures a TE "$TE_n$" of the third echo signal. Due to a gradient offset, it is shown that the TE "$TE_p$" of the first echo signal differs from the TE "$TE_n$" of the third echo signal.

Also, in an exemplary embodiment, in a case 760 in which the test gradient is applied, the MRI apparatus 100 acquires the fourth echo signal based on the second readout gradient, and measures a TE of the fourth echo signal. Due to the test gradient, an eddy field 765 having an intensity "$G_{eddy}$" affects the fourth echo signal.

That is, due to the eddy field 765, the fourth echo signal is received later than the TE "$TE_n$" of the third echo signal by "$\tau_n$". That is, the MRI apparatus 100 may receive the third and the fourth echo signals with a difference of the TE shift "$\tau_n$".

Thus, in a case of the second readout gradient, Equations (4) and (5) may be rewritten as the following Equations (6) and (7):

$$G_{eddy}*(TE_n+\tau_n) = -\tau_n*(-G_{read}+G_{offset}) \tag{6}$$

$$\beta_n = \frac{G_{eddy}}{-G_{read}+G_{offset}} = \frac{-\tau_n}{TE_n+\tau_n} \tag{7}$$

Accordingly, the following Equation (8) may be derived from Equations (5) and (7):

$$\frac{G_{eddy}}{G_{read}} = \frac{2*\beta_n*\beta_p}{\beta_n-\beta_p} \tag{8}$$

A linear component "a" of an eddy field when the gradient offset $G_{offset}$ exists may be expressed as the following Equation (9) instead of Equation (3), from Equation (8):

$$\alpha = \frac{G_{eddy}}{G_{test}} = \frac{G_{read}}{G_{test}} * \frac{2*\beta_n*\beta_p}{\beta_n-\beta_p} \tag{9}$$

That is, in Equations (5) and (7), two constants "$\beta_p$" and "$\beta_n$" are defined by using the TEs and TE shifts of four received echo signals. Therefore, the linear component "$\alpha$" of the eddy field may be expressed using the two constants "$\beta_p$" and "$\beta_n$", and thus, a characteristic value of the eddy field may be expressed using the TEs of the four echo signals.

The MRI apparatus 100 according to an exemplary embodiment may set an absolute value of an intensity of a readout gradient to the same intensity as a test gradient (i.e., "$G_{read}$"="$G_{test}$"). In this case, the linear component "$\alpha$" of the eddy field may be more simply expressed than Equation (9).

The MRI apparatus 100 according to an exemplary embodiment may measure a characteristic value of an eddy current from which an influence of a gradient offset is substantially removed, and further measure the gradient offset from the TEs of the four echo signals. That is, the gradient offset may be expressed as the following Equation (10) from Equations (5) and (7):

$$G_{offset} = G_{read} * \frac{\beta_n + \beta_p}{\beta_n - \beta_p} \quad (10)$$

When "$\beta_p$" and "$\beta_n$" are respectively expressed through a TE and a TE shift of an echo signal, the linear component "a" of Equation (9) may be expressed as the following Equation (11), and the gradient offset of Equation (10) may be expressed as the following Equation (12):

$$\alpha = \frac{G_{read}}{G_{test}} * \frac{2 * \tau_n * \tau_p}{TE_n * \tau_p - TE_p * \tau_n} \quad (11)$$

$$G_{offset} = G_{read} * \frac{TE_n * \tau_p + TE_p * \tau_n + 2 * \tau_n * \tau_p}{TE_p * \tau_n - TE_n * \tau_p} \quad (12)$$

As described above, the MRI apparatus 100 may apply test gradients having different intensities while changing a readout gradient, and thus receive a plurality of echo signals. Accordingly, the MRI apparatus 100 may measure a characteristic value of an eddy field from TEs and TE shifts of the plurality of echo signals and remove an influence of a gradient offset from the eddy field.

FIG. 8 is a detailed flowchart illustrating a magnetic field measuring method according to an exemplary embodiment. In FIG. 8, a description of the same operations as described with reference to FIGS. 5 and 6 will be omitted.

In operation 810, the MRI apparatus 100 according to an exemplary embodiment applies an RF pulse, and in operation 820, the MRI apparatus 100 acquires two echo signals based on a first readout gradient. That is, the MRI apparatus 100 applies test gradients having different intensities to acquire the two echo signals. In operation 830, the MRI apparatus 100 measures a TE shift between the two echo signals. In operations 840 and 850, the MRI apparatus 100 measures the acquired TE shift of the two echo signals based on a second readout gradient.

In operation 860, the MRI apparatus 100 calculates a gradient offset with TEs and TE shifts of four echo signals. The above-described Equations (10) and (12) may be applied.

In operation 870, the MRI apparatus 100 determines a characteristic value of an eddy field with the gradient offset which is calculated in operation 860. The MRI apparatus 100 may repeatedly perform the above-described operations 810 to 860 on TEs of a plurality of echo signals, and thus may more accurately measure the characteristic value of the eddy field.

The MRI apparatus 100 compensates for the eddy field in operation 880. That is, the MRI apparatus 100 generates a pulse for reducing an influence of the eddy field and applies the pulse in applying a gradient magnetic field to the gradient coil, thus more accurately realizing a desired gradient magnetic field.

The above-described methods for measuring a magnetic field according to exemplary embodiments may be written as computer programs and may be implemented in general-use digital computers that execute the computer programs using computer-readable recording media. The information used in the aforementioned embodiments may be recorded in computer-readable recording media through various members. Computer program storage devices including executable computer codes for performing various methods according to exemplary embodiments should not be understood as including transitory targets like signals. Examples of the computer-readable recording medium include magnetic storage media, e.g., read-only memories (ROMs), floppy disks, hard disks, etc., and optical recording media, e.g., compact disk read-only memories (CD-ROMs) or digital video disks (DVDs).

As described above, despite a gradient offset, the above-described magnetic field measuring method and MRI apparatus may more accurately measure a linear component, which is a characteristic value, of an eddy field by using a plurality of echo signals which are measured based on readout gradients having different intensities. Accordingly, a desired gradient magnetic field intended by the MRI apparatus may be obtained by compensating for an eddy current, thus improving a quality of an MRI image.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A magnetic resonance imaging (MRI) apparatus for measuring a magnetic field, the MRI apparatus comprising:
   a radio frequency (RF) transmitter configured to apply an RF pulse to an object;
   a gradient amplifier configured to apply test gradients having different intensities;
   an RF receiver configured to acquire a first echo signal and a second echo signal from a first readout gradient and acquire a third echo signal and a fourth echo signal from a second readout gradient, according to the test gradients; and
   an eddy current compensation processor configured to determine a characteristic value of an eddy field based on an echo time (TE) of at least one of the first through the fourth echo signals.

2. The MRI apparatus of claim 1, wherein the eddy current compensation processor determines the characteristic value of the eddy field for which an influence of a gradient offset is compensated.

3. The MRI apparatus of claim 1, wherein the characteristic value includes a ratio of an intensity of the eddy field to an intensity of a reference gradient.

4. The MRI apparatus of claim 1, wherein the eddy current compensation processor determines the characteristic value by using a TE shift between the first and the second echo signals and a TE shift between the third and the fourth echo signals.

5. The MRI apparatus of claim 4, wherein the eddy current compensation processor performs frequency conversion on data of the first through the fourth echo signals to measure the first and the second TE shifts.

6. The MRI apparatus of claim 1, wherein the RF receiver acquires the first and the third echo signals when a test gradient having a first intensity is applied, and acquires the second and the fourth echo signals when a test gradient having a second intensity that is different from the first intensity is applied.

7. The MRI apparatus of claim 6, wherein one of the first and the second intensities is substantially equal to zero.

8. The MRI apparatus of claim 6, wherein the first and the second intensities have a same absolute value and opposite polarities.

9. The MRI apparatus of claim 1, wherein the first and the second readout gradients have different intensities.

10. The MRI apparatus of claim 9, wherein the intensities of the first readout gradient and the second readout gradient have a same shape and opposite polarities.

11. The MRI apparatus of claim 1, wherein the eddy current compensation processor measures a gradient offset based on the TEs of the at least one of the first through the fourth echo signals, and determines a characteristic value of the eddy field based on the gradient offset.

12. The MRI apparatus of claim 11, wherein the eddy current compensation processor determines the characteristic value by using a first TE shift between the first and the second echo signals and a second TE shift between the third and the fourth echo signals.

13. The MRI apparatus of claim 1, wherein the eddy current compensation processor corrects an eddy current based on the characteristic value of the eddy field.

14. The MRI apparatus of claim 1, wherein,
the RF pulse is a 90-degree RF pulse, and
the first through the fourth echo signals are gradient echo signals that are responses to the 90-degree RF pulse.

15. A magnetic field measuring method of a magnetic resonance imaging (MRI) apparatus, the magnetic field measuring method comprising:
applying a radio frequency (RF) pulse to an object;
acquiring a first echo signal and a second echo signal from a first readout gradient according to test gradients having different intensities;
acquiring a third echo signal and a fourth echo signal from a second readout gradient according to the test gradients having different intensities; and
determining a characteristic value of an eddy field based on an echo time (TE) of at least one of the first through the fourth echo signals.

16. The magnetic field measuring method of claim 1, wherein the determining comprises determining the characteristic value of the eddy field for which an influence of a gradient offset is compensated.

17. The magnetic field measuring method of claim 1, wherein the determining comprises determining the characteristic value including a ratio of an intensity of the eddy field to an intensity of a reference gradient.

18. The magnetic field measuring method of claim 1, wherein the determining comprises determining the characteristic value by using a first TE shift between the first and the second echo signals and a second TE shift between the third and the fourth echo signals.

19. The magnetic field measuring method of claim 4, wherein the determining comprises frequency converting data of the first through the fourth echo signals to measure the first and the second TE shifts.

20. An apparatus for measuring a magnetic field in a magnetic resonance imaging (MRI) apparatus, the apparatus comprising:
at least one processor operable to read and operate according to instructions within a computer program; and
at least one memory operable to store at least portions of said computer program for access by said processor;
wherein said program includes algorithms to cause said processor to implement:
an eddy current characteristic determination module configured to determine a characteristic value of an eddy field based on echo times (TEs) of at least two gradient echo signals generated according to at least one test gradient; and
an eddy current compensation module configured to compensate for an eddy current based on the determined characteristic value of the eddy field.

21. The apparatus of claim 20, wherein the at least two gradient echo signals comprise a first gradient echo signal generated when the at least one test gradient is not applied and a second gradient echo signal generated when the at least one test gradient is applied.

22. The apparatus of claim 21, wherein the at least one test gradient comprises a first test gradient having a first intensity and a second test gradient having a second intensity, wherein the first and the second intensities have a same absolute value and opposite polarities.

23. The apparatus of claim 22, wherein the at least two gradient echo signals comprise a first gradient echo signal generated based on a first readout gradient and a second gradient echo signal generated based on a second readout gradient, wherein the first and the second readout gradients have different intensities.

* * * * *